United States Patent
Wan

(10) Patent No.: US 12,293,084 B2
(45) Date of Patent: May 6, 2025

(54) OPERATING METHOD FOR A MEMORY, A MEMORY, AND A MEMORY SYSTEM TO IMPROVE PROGRAMMING EFFICIENCY

(71) Applicant: Yangtze Memory Technologies Co., Ltd., Hubei (CN)

(72) Inventor: Weijun Wan, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 210 days.

(21) Appl. No.: 18/148,763

(22) Filed: Dec. 30, 2022

(65) Prior Publication Data

US 2024/0168642 A1    May 23, 2024

(30) Foreign Application Priority Data

Nov. 18, 2022    (CN) .......................... 202211449084.8

(51) Int. Cl.
*G11C 16/04*    (2006.01)
*G06F 3/06*    (2006.01)

(52) U.S. Cl.
CPC .......... *G06F 3/0613* (2013.01); *G06F 3/0653* (2013.01); *G06F 3/0659* (2013.01); *G06F 3/0679* (2013.01); *G11C 16/0483* (2013.01)

(58) Field of Classification Search
CPC .................................................. G11C 16/0483
USPC ....................................................... 365/185.22
See application file for complete search history.

(56) References Cited

U.S. PATENT DOCUMENTS

| | | | |
|---|---|---|---|
| 8,174,894 B2 * | 5/2012 | Kim ...................... | G11C 16/10 365/185.18 |
| 2010/0214844 A1 * | 8/2010 | Lee ...................... | G11C 11/5642 365/185.18 |
| 2011/0096597 A1 * | 4/2011 | Aritome ............. | G11C 16/3454 365/185.11 |
| 2020/0051620 A1 * | 2/2020 | Li .......................... | G11C 16/10 |
| 2022/0188177 A1 * | 6/2022 | Lee ........................ | G11C 16/10 |

* cited by examiner

*Primary Examiner* — Sung Il Cho
(74) *Attorney, Agent, or Firm* — Hanley, Flight & Zimmerman, LLC

(57) ABSTRACT

An operating method for a memory, a memory, and a memory system are provided in the present application. The memory includes at least a plurality of word lines and a plurality of strings, and the plurality of word lines include a target word line, and each word line is coupled to a plurality of strings. Each string includes a plurality of memory cells. In accordance with the operating method provided by the present application, the first verification and the second verification are performed on a plurality of target memory cells with first and second verify voltages during performing a first programming operation on a plurality of target memory cells in target string coupled to the target word line, and the second start program voltage is determined based on at least the second verification result, ensuring the accuracy of the second start program voltage.

18 Claims, 10 Drawing Sheets

OPERATING METHOD FOR A MEMORY, A MEMORY, AND A MEMORY SYSTEM TO IMPROVE PROGRAMMING EFFICIENCY

CROSS REFERENCE TO RELATED APPLICATION

This application claims priority to and the benefit of Chinese Patent Application 202211449084.8, filed on Nov. 18, 2022, which is hereby incorporated by reference in its entirety.

TECHNICAL FIELD

The present application generally relates to semiconductors and, more particularly, relates to an operating method for a memory, a memory, and a memory system.

BACKGROUND

With the continuous advancement of electronic technology, memory devices are needed for many real-life application scenarios. In view of this, it is currently a challenge to reduce the programming time of a memory and improve the programming efficiency of the memory.

BRIEF DESCRIPTION OF THE DRAWINGS

The drawings that are employed in the description of the examples in accordance with the present application will be briefly introduced below to illustrate the technical solutions of the present application more clearly. It is apparent that the drawings in the following description are merely some examples of the present application. Additional drawings can be obtained for those skilled in the art without any creative effort, based on these drawings.

DETAILED DESCRIPTION

The technical solutions in the examples of the present application will be described clearly and completely below with reference to the drawings in the examples of the present application. It is apparent that the described examples are merely part of the examples of the present application, but not all of them.

Figure 1:
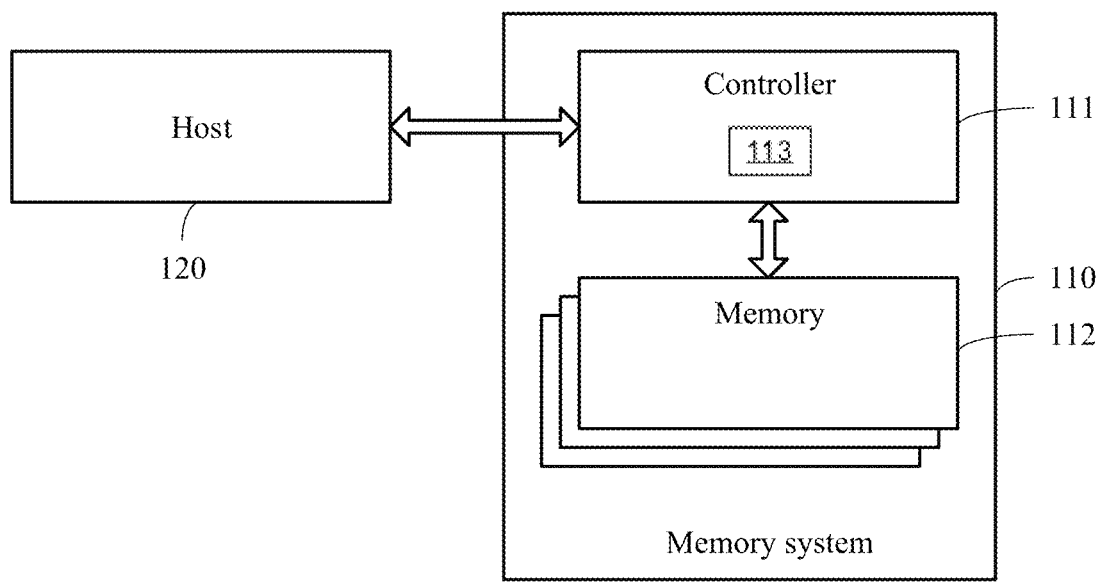
FIG. 1 is a schematic diagram of an example system with a memory system according to an example of the present application.

Referring to FIG. 1, which shows a schematic diagram of an example system 100 having a memory system 110 according to an example of the present application. The system 100 may be, for example, a mobile phone, desktop computer, laptop computer, tablet computer, vehicle computer, game console, printer, locating device, wearable electronic device, smart sensor, virtual reality (VR) device, augmented reality (AR) device or any other suitable electronic device having a memory therein. As shown in FIG. 1, the above-mentioned system 100 may at least include the memory system 110 and a host 120. The memory system 110 has a controller 111 and one or more memories 112. The host 120 may be a processor (for example, a central processing unit, CPU) of an electronic device or a system-on-chip (SoC) (for example, an application processor, AP). Specifically, the host 120 can be configured to send data to the memory 112, or receive data from the memory 112.

According to some implementations, the controller 111 is coupled to the memory 112 and the host 120, and is configured to control the memory 112. Further, the controller 111 can manage data stored in the memory 112 and communicate with the host 120. In some implementations, the controller 111 is designed to operate in a low duty cycle environment, which may be a Secure Digital (SD) card, a Compact Flash (CF) card, Universal Serial Bus (USB) flash drives or other media used in electronic devices such as personal computers, digital cameras, mobile phones, and the like. In some implementations, the controller 111 is designed to operate in a high duty cycle environment, which may be a Solid State Drives (SSD) or an embedded Multi Media Card (eMMC), and can be used as enterprise memory arrays or data storage devices for mobile devices such as smartphones, tablets, laptops, etc.

The controller 111 may be configured 113 to control operations of the memory 112, such as a read operation (Read), an erase operation (Erase) and a programming operation (Program). The controller 111 may also be configured to manage various functions related to data stored or to be stored in the memory 112, including but not limited to bad block management, garbage collection, logical-to-physical address translation, and wear leveling, among others. In some examples, the controller 111 is also configured to process error correction code (ECC) related to data read from or written to the memory 112. In some examples, the controller 111 may be further configured to perform any other suitable functions, such as formatting the memory 112. Further, in some examples, the controller 111 is configured to fully or partially execute the operating method described in detail below.

The controller 111 may communicate with external devices (e.g., the host 120) according to a specific communication protocol. As an example, the controller 111 can communicate with external devices through at least one of various interface protocols, and the interface protocols can be, for example, Universal Serial Bus (USB) protocol, Multi Media Card (MMC) protocol, peripheral component interconnection (PCI) protocol, Peripheral Component Interconnect Express (PCI-E) protocol, Advanced Technology Attachment (ATA) protocol, serial ATA protocol, parallel ATA protocol, Small Computer System Interface (SCSI) protocol, Enhanced Small Device Interface (ESDI) protocol, Integrated Drive Electronics (IDE) protocol, FireWire protocol, etc.

The controller 111 and one or more memories 112 can be integrated in various types of memory devices, for example, in the same package, and further, the package can be, for example, Universal Flash Storage (UFS) package or embedded multimedia card (eMMC) package, etc. That is, the memory system 110 can be implemented and packaged into different types of terminal electronic products.

Figure 2A:
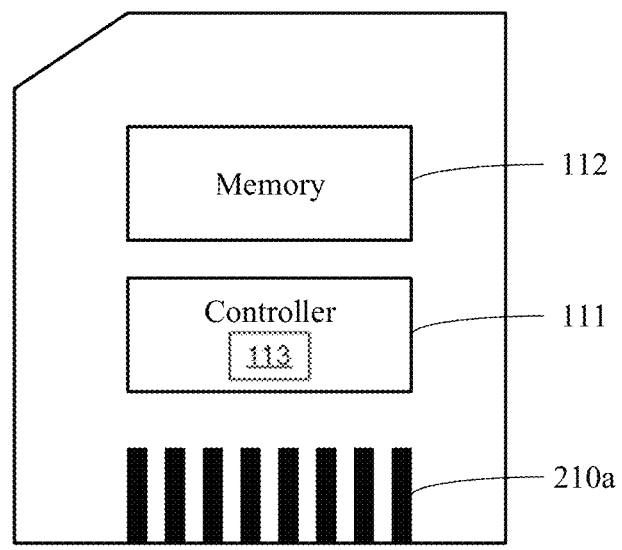
FIG. 2*a* is a schematic diagram of an example memory card with a memory system according to an example of the present application.

For example, in an example shown in FIG. 2a, the controller 111 and the single memory 112 can be integrated in a memory card 200a. Further, the memory card 200a can be, for example, a PC card (Personal Computer Memory Card International Association, PCMCIA), Compact Flash (CF) card, Smart Media (SM) card, Memory Stick, Multimedia Card (including at least: Multimedia (MMC) card, Reduced Size MMC (RS-MMC) card and Multimedia Micro (MMC micro) card), SD card (including at least: Secure Digital (SD) card, Mini-Secure Digital (mini-SD) card, Micro-Secure Digital (micro-SD) card and Secure Digital High Capacity (SDHC) card) and Universal Flash Storage (UFS) card, and/or the like. Further, as shown in FIG. 2a, the memory card 200a may further include a memory card connector 210a that couples the memory card 200a to a host (the host 120 in FIG. 1, for example).

Figure 2B:
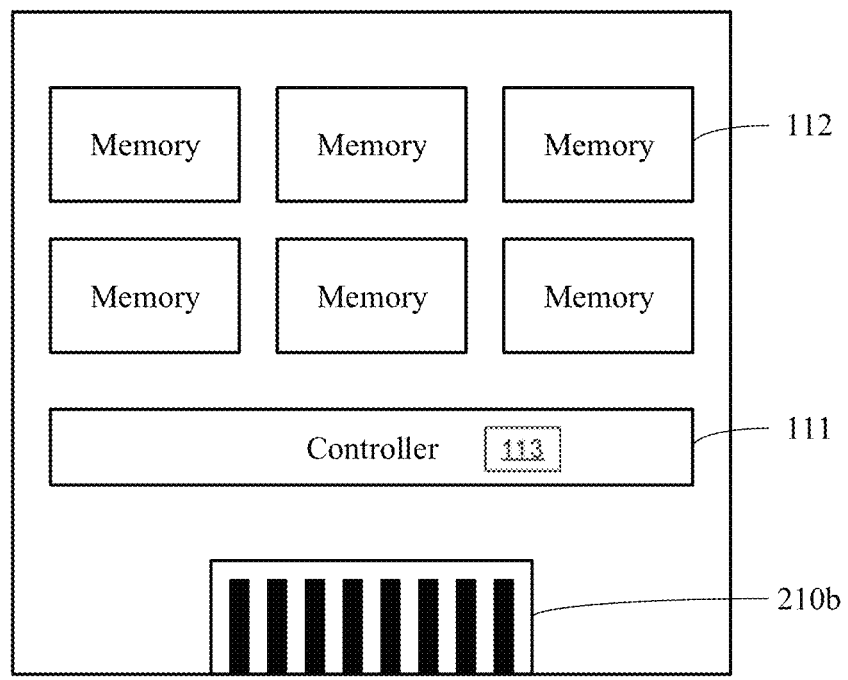
FIG. 2*b* is a schematic diagram of an example solid-state drive with a memory system according to an example of the present application.

As another example, in another example shown in FIG. 2b, the controller 111 and multiple memories 112 may be integrated into a solid-state drive (SSD) 200b. The solid state drive 200b may further include a solid state drive connector 210b that couples the solid state drive 200b to a host (the host 120 in FIG. 1, for example).

In some implementations, the storage capacity and/or operating speed of the solid state drive 200b is higher than the storage capacity and/or operating speed of the memory card 200a.

It is noted that the memory 112 may be a memory such as a three-dimensional NAND memory (3D NAND Flash). Next, please refer to FIG. 3a and FIG. 3b, which exemplarily illustrate schematic top view and schematic perspective view of the structural division of the three-dimensional NAND memory 300, respectively.

Figure 3A:
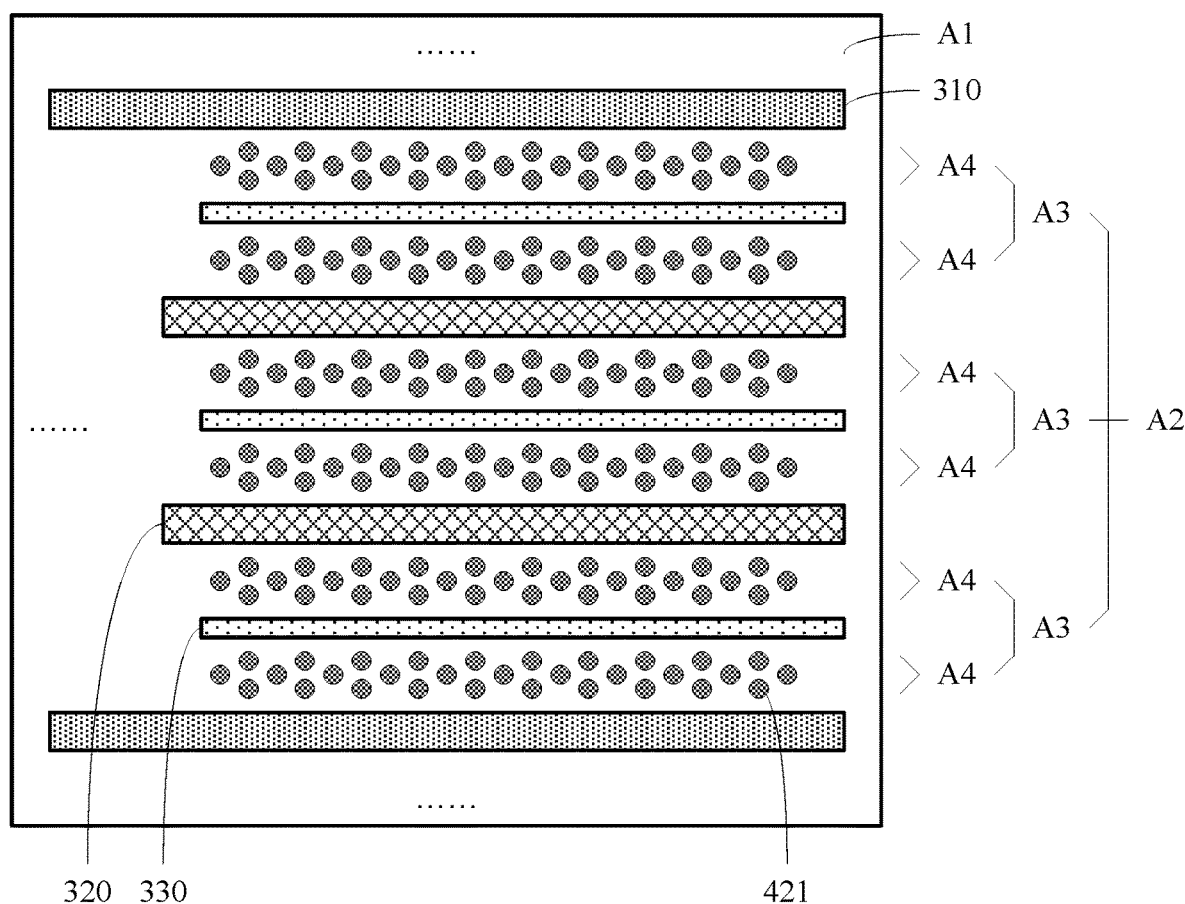
FIG. 3*a* is a schematic top view of the structural division of a three-dimensional NAND memory according to an example of the present application.
Figure 3B:
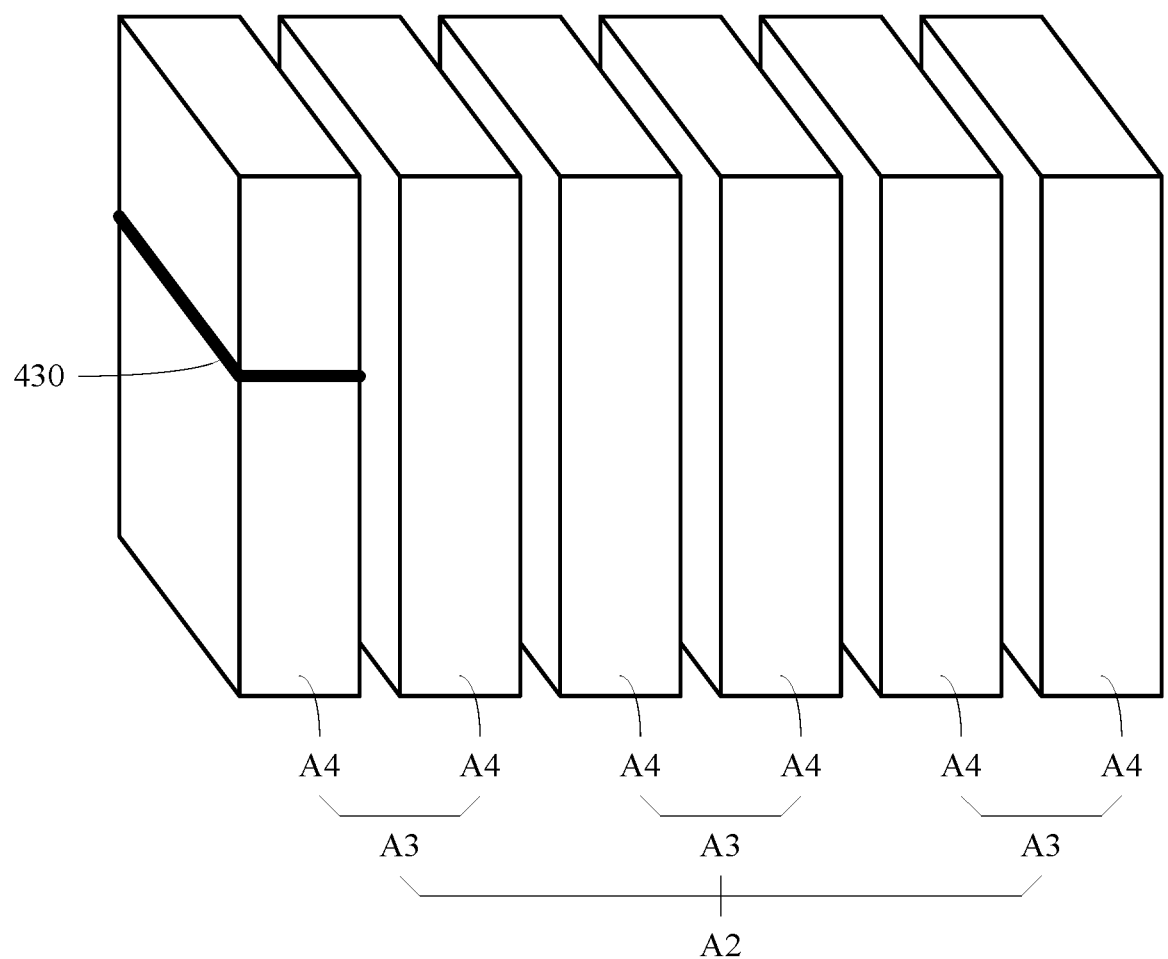
FIG. 3*b* is a schematic perspective diagram of the structural division of the three-dimensional NAND memory according to an example of the present application.

As shown in FIG. 3a and FIG. 3b, the three-dimensional NAND memory 300 has at least a giant block (GB) A1, and includes at least a first gate gap structure 310, a second gate gap structure 320 and a top selection gate gap structure 330.

Specifically, the first gate gap structure 310 is arranged in the giant block A1, and is used to divide the giant block A1 into a plurality of blocks A2. The second gate gap structure 320 is arranged in the block A2, and is used to divide the corresponding block A2 into a plurality of fingers A3. The top selection gate gap structure 330 is arranged in the finger A3, and is used to divide the corresponding finger A3 into a plurality of strings A4. In the example of FIG. 3a and FIG. 3b, one block A2 includes three fingers A3, and one finger A3 includes two strings A4. In other words, one block A2 includes six strings A4. It is noted that, in practical applications, the number of strings A4 in one block A2 is not limited thereto.

Figure 4:
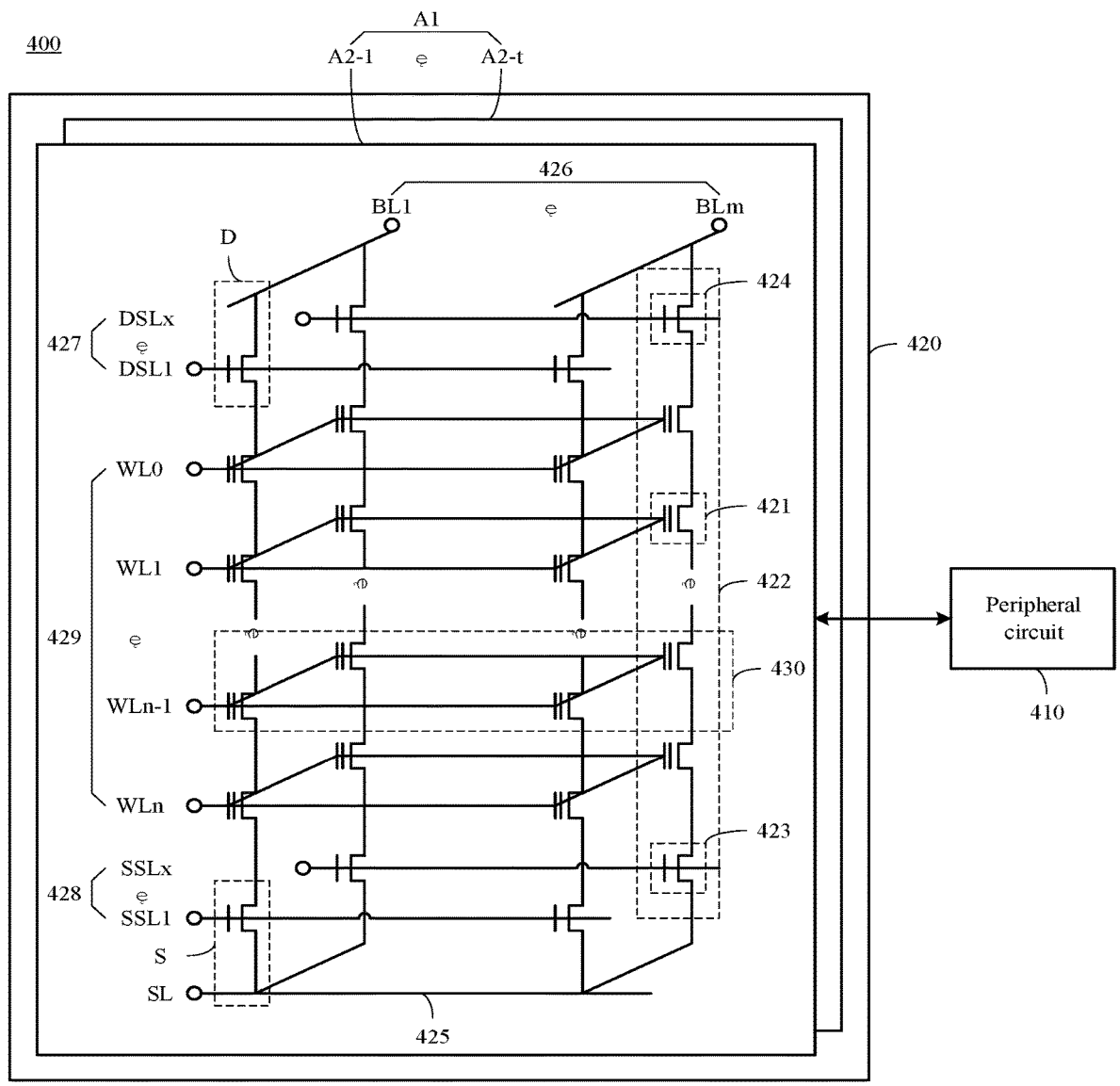
FIG. 4 is a schematic diagram of an example memory including a peripheral circuit according to an example of the present application.

With reference to FIG. 4, which shows a schematic diagram of an example memory 400 including a peripheral circuit 410 according to an example of the present application, the memory 400 may be an example of the memory 112 in FIG. 1, and the memory 400 may include the peripheral circuit 410 and a memory array 420. Next, description will be made by taking the memory 400 as the above-mentioned three-dimensional NAND memory 300 as an example.

As shown in FIG. 4, in the memory 400, the memory array 420 includes at least a plurality of memory cells 421. Specifically, the memory cells 421 are provided in the form of an array of NAND memory strings 422, and each NAND memory string 422 extends vertically above the substrate (not shown in FIG. 4). In some implementations, each NAND memory string 422 includes a plurality of memory cells 421 coupled in series and stacked vertically. Further, each memory cell 421 may hold a continuous analog value, e.g., voltage or charge, which depends on the number of electrons that each memory cell 421 has trapped within the corresponding area. Specifically, the memory cell 421 may be a floating gate memory cell including a floating gate transistor, or may be a charge trap memory cell including a charge trapping transistor.

In some implementations, each memory cell 421 can be a single-level cell (SLC), where the single-level cell has two-order threshold statuses, so each single-level cell can store data of one bit. For example, a first-order threshold status of "0" may correspond to a first voltage range, and a second-order threshold status of "1" may correspond to a second voltage range. In other implementations, each memory cell 421 may be a multi-level cell capable of storing more than one bit of data in multiple orders of threshold statuses of more than two orders. For example, each memory cell 421 may be a Multi Level Cell (MLC) capable of storing data of two bits, may be a Triple Level Cell (TLC) capable of storing data of three bits, or may be a Quad Level Cell (QLC) capable of storing data of four bits. Specifically, one of the multiple orders of threshold statuses of the memory cell 421 is an erased state.

Still with reference to FIG. 4, each NAND memory string 422 has a source S and a drain D, and each NAND memory string 422 includes at least a bottom select gate (BSG) 423 located at the source S and a top select gate (TSG) 424 located at the drain D. The bottom select gate 423 and the top select gate 424 may be configured to activate the selected NAND memory string 422 during read and programming operation s. Further, the sources S of the NAND memory strings 422 in the same block A2 are coupled through the same source line (SL) 425; that is, all the NAND memory strings 422 in the same block A2 are coupled to the array common source (ACS). Further, the top select gate 424 in each NAND memory string 422 is coupled to a respective bit line (BL) 426 (including bit line BL0 to bit line BLn), and can read data from or write data into the respective bit line BL via an output bus (not shown in FIG. 4). In some implementations, each NAND memory string 422 is configured to be selected or deselected by applying to the respective top select gate 424 a selection voltage (e.g., higher than a threshold voltage of a transistor with the top select gate 424) or a deselection voltage (for example, 0V) via one or more drain select line (DSL) 427, and/or, by applying to the respective bottom select gate 423 a selection voltage (e.g., higher than a threshold voltage of a transistor with the bottom select gate 423) or a deselection voltage (for example, 0V) via one or more source select lines (SSL) 428.

As shown in FIG. 4, each block A2 includes a plurality of NAND memory strings 422, and each block A2 has a common source line 425 that can be coupled to ground (GND). In some implementations, a block A2 is the basic data unit for the erase operation, that is, the data stored in all memory cells 421 in the same block A2 will be completely erased in a complete erase operation. When performing an erase operation on the memory cells 421 in the selected block A2, an erase voltage (V_erase, which may be, for example, a higher positive voltage, by way of example, 20V or higher) may be applied to the source line 425 of the selected block A2. Further, the source line 425 coupled to the selected block A2 may be coupled to unselected blocks A2 at the same time. It should be understood that, in some examples, the above-described erase operation may also be performed at the half-block level, at the quarter-block level, at a level with any suitable number of blocks, or at a level with any suitable fraction of blocks.

Still with reference to FIG. 4, and referring to the above-mentioned FIG. 3a and FIG. 3b, in the memory 400, the memory array 420 also includes a plurality of word lines (WLs) 429 (including word line WL0 to word line WLn), and adjacent NAND memory strings 422 can be coupled via the word line WL. Further, a plurality of memory cells 421 in a string A4 coupled by a word line WL can be called a page 430, which is a basic data unit for a programming operation. Further, the size of a page 430 in units of bits may be related to the number of NAND memory strings 422 coupled to the word line WL in a string A4, and also related to the type of the memory cell 421. For example, when the memory cell 421 is the above-mentioned three-level cell TLC, and the number of NAND memory strings 422 coupled to the word line WL is a, the amount of data that can be stored in one page 430 is: 3*a bit. Each word line WL may include a plurality of control gates (also referred to as "gate electrode") located at each memory cell 421 in the corresponding page 430, and a gate line coupled to the control gates.

Referring now back to FIG. 4, in the memory 400, the peripheral circuit 410 may be coupled to the memory array 420 via the bit line BL, the word line WL, the source line 425, the drain selection gate line DSL and the source selection gate line SSL. Further, the peripheral circuit 410 may include any suitable analog circuit, digital circuit, and mixed-signal circuit to apply voltage signals and/or current signals to selected memory cells 421 (also referred to as "target memory cells") and sense voltage signals and/or current signals from each target memory cell to perform corresponding operations of the memory array 420 via bit line BL, word line WL, source line 425, drain select gate DSL and source select gate line SSL. Specifically, the peripheral circuit 410 may include various types of circuits formed using, for example, Metal Oxide Semiconductor (MOS) technology.

Figure 5:
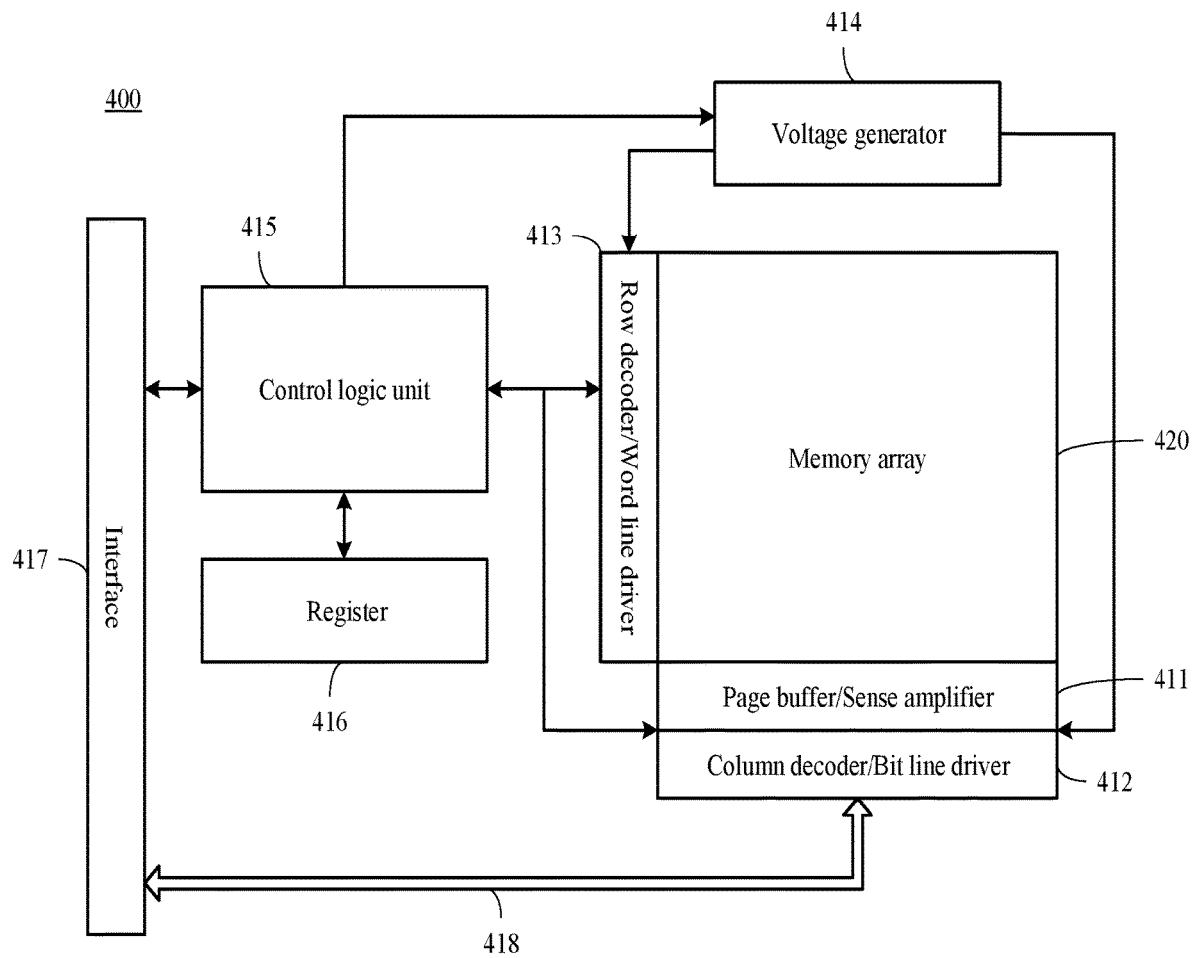
FIG. 5 is a schematic diagram of an example memory including a memory array and a peripheral circuit according to an example of the present application.

Referring to FIG. 5, which shows a schematic diagram of an example memory 400 including a memory array 420 and a peripheral circuit 410 according to an example of the present application. As illustrated in FIG. 5, the peripheral circuit 410 may include at least a page buffer/sense amplifier 411, a column decoder/bit line driver 412, a row decoder/word line driver 413, a voltage generator 414, a control logic unit 415, a register 416, an interface 417 and a data bus 418. It should be understood that, in some examples, the peripheral circuit 410 may further include other circuits not shown in FIG. 5.

The page buffer/sense amplifier 411 may be configured to read data from and program (also referred to as "write") data into the memory array 420 according to control signals from the control logic unit 415. Specifically, in one example, the page buffer/sense amplifier 411 may store data to be programmed into one page 430 of the memory array 420. In another example, the page buffer/sense amplifier 411 may perform a program verification operation (Verify) to ensure that data has been correctly programmed into the memory cells 421 coupled to the selected word line WL. In yet another example, the page buffer/sense amplifier 411 may further perform an operation of sensing a low power signal from the bit line BL representing the data stored in the memory cell 421 and amplify the small voltage swing of the low power signal to recognizable logic levels during a read operation.

The column decoder/bit line driver 412 may be configured to be controlled by control logic unit 415 and select one or more NAND memory strings 422 by applying bit line voltages generated from voltage generator 414.

The row decoder/word line driver 413 may be configured to be controlled by the control logic unit 415 to select/deselect the blocks A2 in the memory array 420. The row decoder/word line driver 413 may further be configured to drive the word line WL using the word line voltage generated from the voltage generator 414. In some implementations, the row decoder/word line driver 413 may further perform operations of selecting/deselecting and driving the drain selection gate line DSL and the source selection gate line SSL. As described in detail below, the row decoder/word line driver 413 is configured to perform a programming operation on memory cells 421 coupled to one or more selected word lines WL.

The voltage generator 414 may be configured to be controlled by the control logic unit 415 and generate word line voltages (e.g., read voltages, program voltages, pass voltages, local voltages, verify voltages, etc.), bit line voltages and source line voltages, which are to be supplied to the memory array 420.

The control logic unit 415 may couple with each circuit in the peripheral circuit 410 as described above, such as page buffer/sense amplifier 411, column decoder/bit line driver 412, row decoder/word line driver 413, and voltage generator 414, and control the operation of each circuit.

The register 416 may be coupled to the control logic unit 415, and may include at least a status register, a command register, and an address register that store status information, command operation code (OP code) and command address for controlling the operation of each of the above circuits.

Interface 417 may be coupled to the control logic unit 415 and serve as a control buffer to perform operations of buffering control commands received from a host (not shown in FIG. 5) and relaying the commands to the control logic unit 415, as well as operations of buffering the status information received from the control logic unit 415 and relaying the commands to the host. Further, the interface 417 can be further coupled to the column decoder/bit line driver 412 via the data bus 418, and serve as a data Input/Output (I/O) interface and a data buffer to perform operations of buffering of data and relaying data to the memory array 420 as well as operations of relaying or buffering data from the memory array 420.

Figure 6:
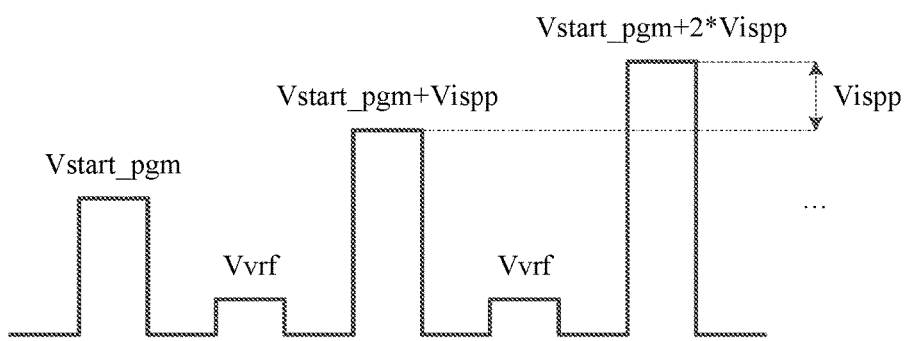
FIG. 6 is a schematic diagram of performing a programming operation on memory cells of a memory in an incremental stepping pulse programming manner according to an example of the present application.

It is noted that, as shown in FIG. 6, an incremental step programming pulse (ISPP) is employed to perform a programming operation on the memory cells of the memory in some implementation. Specifically, after starting the programming operation, firstly, a start program voltage ("Vstart_pgm" as indicated in FIG. 6) is applied to a target word line coupled to the target memory cell to be programmed, so that electrons in a channel of the target memory cell tunnel to its floating gate (it should be understood that when the memory cell is a charge-trap memory cell, the start program voltage makes the electrons in the channel of the target memory cell tunnel to its charge capture layer to reach a certain threshold state, and then a verify voltage ("Vvrf" as indicated in FIG. 6) is applied to the target word line to verify whether the target memory cell is programmed into the desired target threshold state. If the result of the verification indicates that the target memory cell has not been programmed into the target threshold state, then a voltage higher than the start program voltage by a preset step voltage ("Vispp" as indicated in FIG. 6) is applied to the target word line to program the target memory cell, and then the above verify voltage is applied to the target word line for verification, until the result of the verification indicates the target memory cell has been programmed into the target threshold state, indicating that the programming operation of the target memory cell is completed.

The inventors of the present application have studied and found that, with the increase in the number of times the memory is used, when performing an erase operation on a memory cell that has been programmed in the memory, there may be such a scenario that the electrons in the floating gate of the memory cells cannot be completely extracted into the channel for a memory whose memory cells are of a floating gate type. Therefore, the memory cell has a certain initial threshold voltage due to a certain number of electrons remaining on the floating gate before the memory cell is subsequently programmed again.

However, for a memory whose memory cells are of a charge-trap type, there may be such a scenario that the electrons in the charge trapping layer of the memory cell cannot be completely neutralized by the holes injected from the channel. Therefore, the memory cell has a certain initial threshold voltage due to a certain number of electrons remaining on the charge trapping layer before the memory cell is subsequently programmed again.

Further, the inventors of the present application have also studied and found that, in the memory, since the times of programming and erasing performed on the memory cells coupled to different word lines are not exactly the same, there will be differences in the number of the electrons remaining on the floating gate, resulting in that initial threshold voltages are not exactly the same as well. If the same start program voltage is used to program memory cells coupled to different word lines, the programming time of different memory cells varies to a greater extent, thus affecting programming efficiency. Moreover, if the programming operation is performed using the same start program voltage during the entire life cycle of the memory, the reliability of the programming operation will also be affected to a certain extent.

In consideration of the above problems, the inventors of the present application propose to apply different start program voltages to memory cells coupled to different word lines (or different word line groups), so as to improve programming speed and programming efficiency.

Specifically, in some implementations, the inventor proposes that some characteristic values related to the start program voltage can be provided to the user when the memory is shipped from the factory, so that the user can autonomously adjust the start program voltage of the memory cells coupled to different word lines or different word line groups.

Furthermore, considering that a page ("430" as indicated in FIG. 3b and FIG. 4) is the basic data unit for performing programming operations, in some implementations, the inventor proposes that one or more pages coupled to a certain word line (or a certain word line group) of the memory can also be designed as sampling pages in the word line (or word line group), and the results of programming operation performed on the sampling page are recorded to adjust and determine the start program voltage of the word line (or the word line group) based on the above recording, and then, when performing programming operations on other page coupled to the word line (or the word line group) other than the sampling page, the adjusted start program voltage is used to improve programming speed and programming efficiency. It should be noted that, in this implementation, the adjusted start program voltage obtained is more accurate, has better real-time performance, and can simplify user operations.

Next, the above-mentioned implementations will be described in detail by taking FIG. 7 as an example.

It should be noted that, as described above, the memory cells have multiple orders of threshold states, and one of the multi-level threshold states is an erased state. In FIG. 7, it is depicted by taking the memory cells in the sampling page are programmed into target threshold state ("Lx" as indicated in FIG. 7) among the multiple orders of threshold states other than the erased state as an example.

Figure 7:
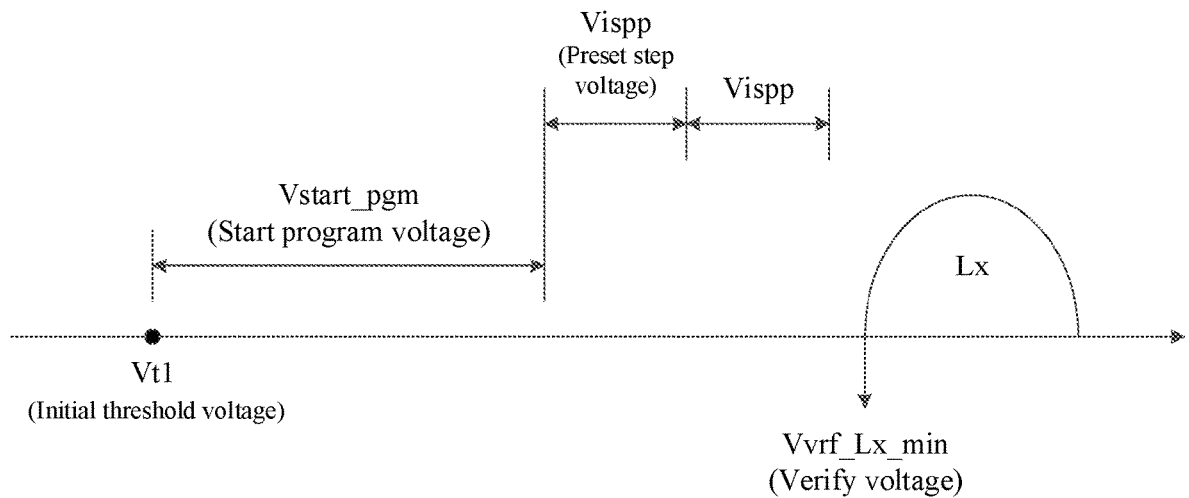
FIG. 7 is a schematic diagram of verifying the threshold states of the memory cells in a sampling page with verify voltages in some implementations.
Figure 8:
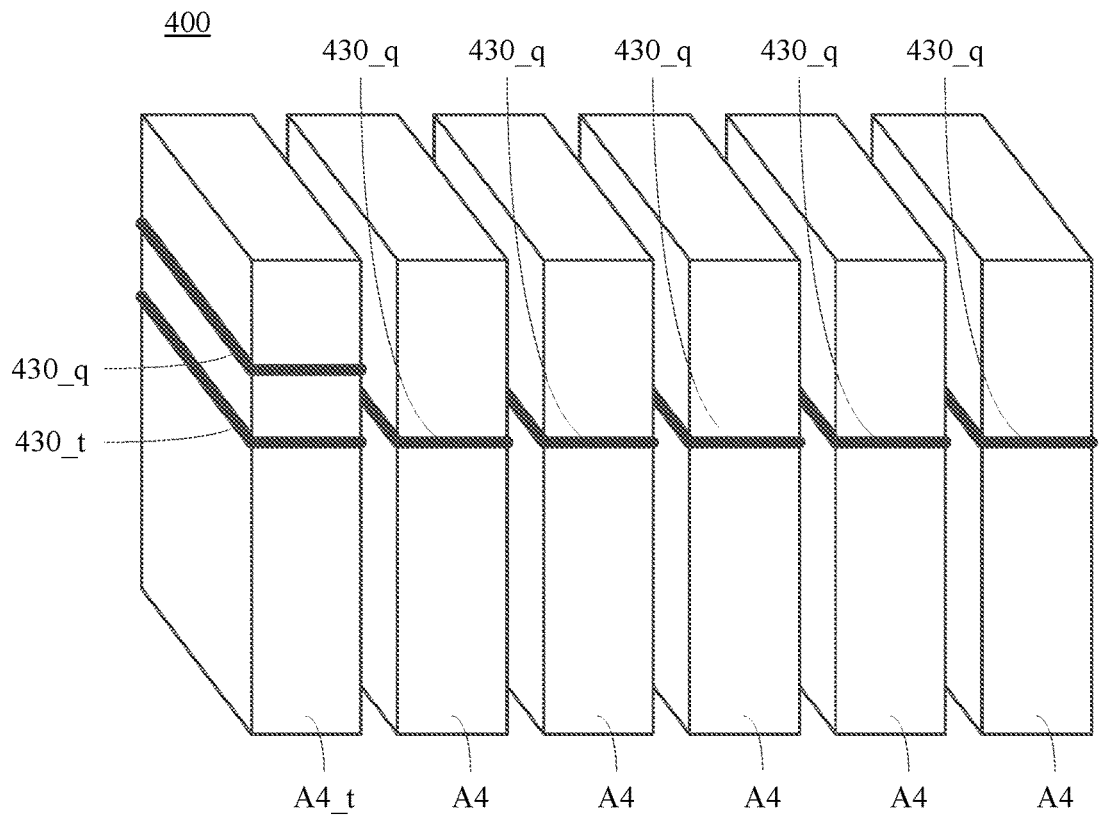
FIG. 8 is a schematic diagram of a three-dimensional structure of a memory according to an example of the present application.

Specifically, in the above-mentioned implementation, during the process of performing the programming operation on the memory cells in the sampling page in the incremental step programming pulse (ISPP) manner, each time a program voltage is applied to the word line coupled to the sampling page, the threshold state of the memory cells in the sampling page is verified with the verify voltage ("Vvrf_Lx_min" as indicated in FIG. 7). When the result of the verification indicates that the number of memory cells programmed into the target threshold state in the sampling page reaches a preset criterion, the number x of the increased preset step voltage is recorded, and the start program voltage of the word line (or word line group) to which the sampling page belongs may be adjusted and determined based on the number x. When performing programming operations on other pages other than the sampling page coupled to the word line (or the word line group), the adjusted start program voltage is used, so as to improve programming speed and programming efficiency.

Specifically, the voltage value of the above-mentioned program voltage is Vstart_pgm+y*Vispp (wherein, the value of y is 0 or a positive integer greater than 0), and the voltage value of the above-mentioned verify voltage is the minimum threshold voltage under the above-mentioned target threshold state Lx. It should be noted that the above number x may indicate the maximum of the number of preset step voltages Vispp that can be increased on the basis of the start program voltage Vstart_pgm when the start program voltage Vstart_pgm needs to be adjusted in order to increase the programming speed, that is, the adjusted start program voltage for using by the other pages can be calculated by the following calculation approach:

$$V\text{start\_pgm}' = V\text{start\_pgm} + x * V\text{ispp} - dsv\_\text{offset}.$$

It should be noted that the "dsv_offset" in the above equation is an offset with a relatively large absolute value and being a fixed value set to prevent the occurrence of an over-program phenomenon when performing a programming operation. For example, the above-mentioned over-program phenomenon may be that when the voltage value of the start program voltage is greater than the maximum threshold voltage in the target threshold state into which the target memory cell is expected to be programmed, the target memory cell will be programmed into an unexpected threshold state (i.e., the target memory cell is programmed into one of multiple orders of threshold states higher than the target threshold state), thereby affecting the reliability of the programming operation.

However, the inventors of the present application has studied and found that, in the above-mentioned implementation, since the minimum adjustment range of the above-mentioned start program voltage is a preset step voltage Vispp, and the difference in the initial threshold values of the memory cells coupled to different word lines is often smaller than a preset step voltage, and at the same time, the absolute value of the above-mentioned offset is relatively large and fixed. Therefore, the adjustment of the start program voltage in the above-mentioned example is not accurate enough.

Referring to FIG. 4, FIG. 8, FIG. 9a, FIG. 9b and FIG. 10, to solve the above and other problems, the inventor of the present application proposes an operating method for a memory 400, where the memory 400 includes at least a plurality of word lines (word line WL0 to word line WLn) and multiple strings A4, the multiple word lines include a target word line (not shown), each word line is coupled to multiple strings A4, and each string includes multiple memory cells 421. The operating method includes at least the following steps:

First program step S101: applying a first start program voltage Vstart_pgm1 to the target word line, and gradually increasing a preset step voltage Vispp on the basis of the first start program voltage Vstart_pgm1, so as to perform a first programming operation on the plurality of target memory cells in the target string A4_t coupled to the target word line;

First verification step S102: during the process of performing the first programming operation and upon each time the preset step voltage is added to the target word line, performing a first verification on the plurality of target memory cells with a first verify voltage Vvrf_coarse1 to obtain a first validation result;

Second verification step S103: when the first verification result indicates that the plurality of target memory cells pass the first verification for the first time, performing a second verification on the plurality of target memory cells with a second verify voltage Vvrf_fine, wherein the first verify voltage is lower than the second verify voltage, and the difference between the first verify voltage and the second verify voltage is lower than the preset step voltage;

Second start program voltage determining step S104: obtaining a second verification result of the second verification, and determining a second start program voltage based at least on the second verification result; and, Second program step S105: applying a second start program voltage to other memory cells other than the plurality of target memory cells, so as to perform a second programming operation on the other memory cells.

It should be noted that, in the first program step S101, the plurality of target memory cells in the target string A4_t coupled to the target word line can be understood as the "sampling page" described above, and is indicated as "430_t" in FIG. 8. Further, similar to what has been described above, in this example, the target memory cell has multiple orders of threshold states, and one of the multiple orders of threshold states is an erased state, and the first program operation is to program the plurality of target memory cells into a target threshold state in the multiple orders of threshold states other than the erased state. The target threshold state is marked with "Lx" in FIG. 9a and FIG. 9b.

Figure 9A:
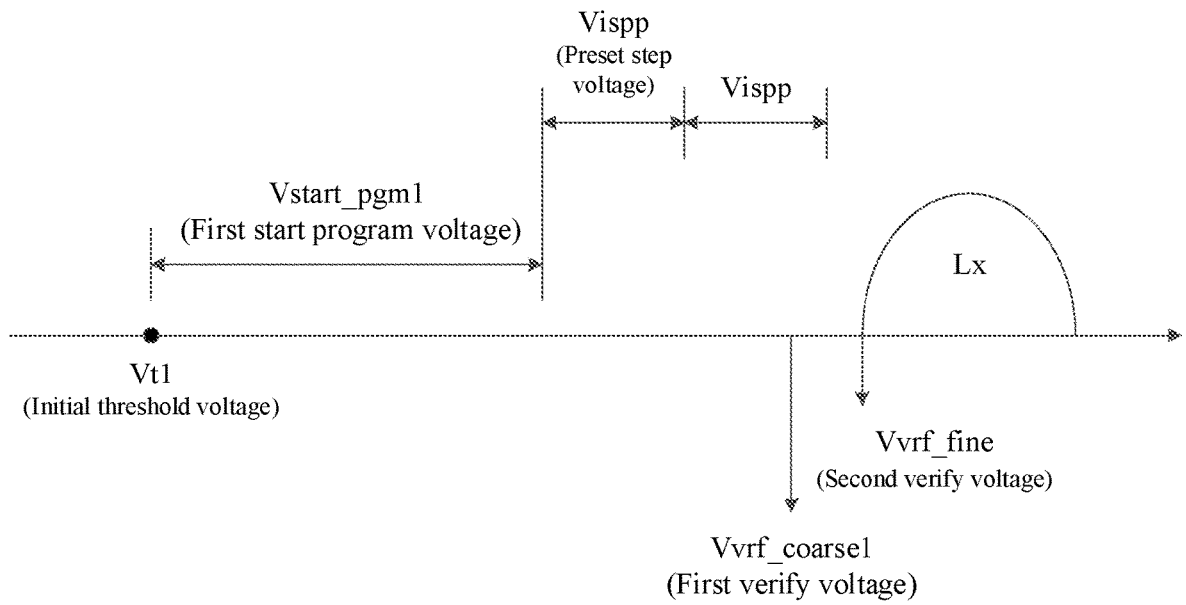
FIGS. 9*a* to 9*b* are schematic diagrams of performing a first verification and second verification on a plurality of target memory cells with a first verify voltage and a second verify voltage according to an example of the present application.
Figure 9B:
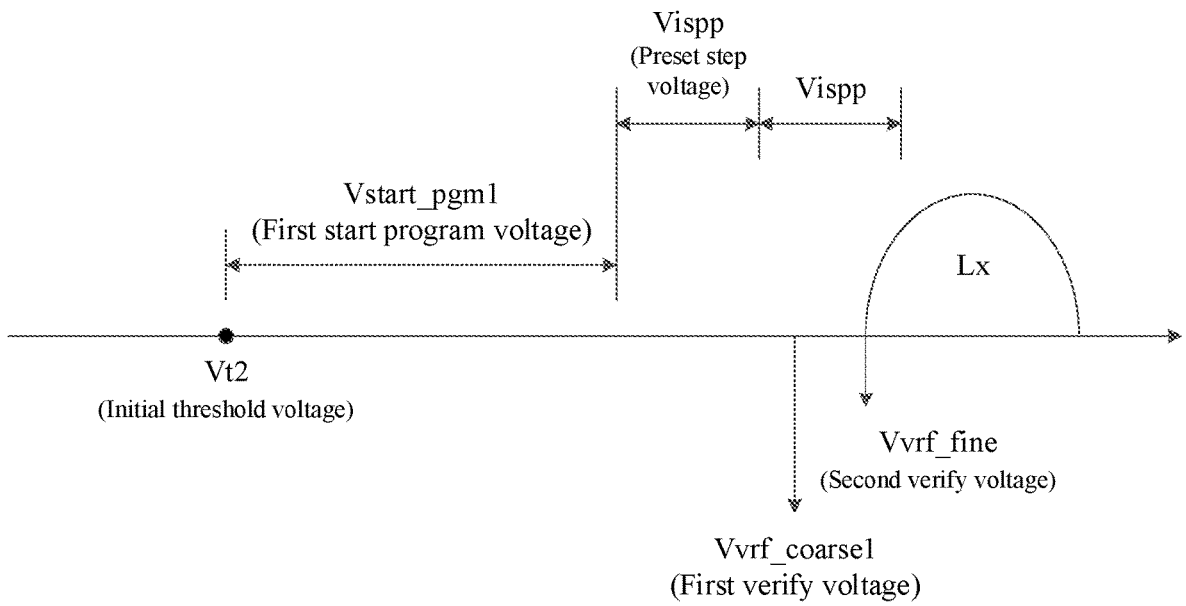
Figure 10:
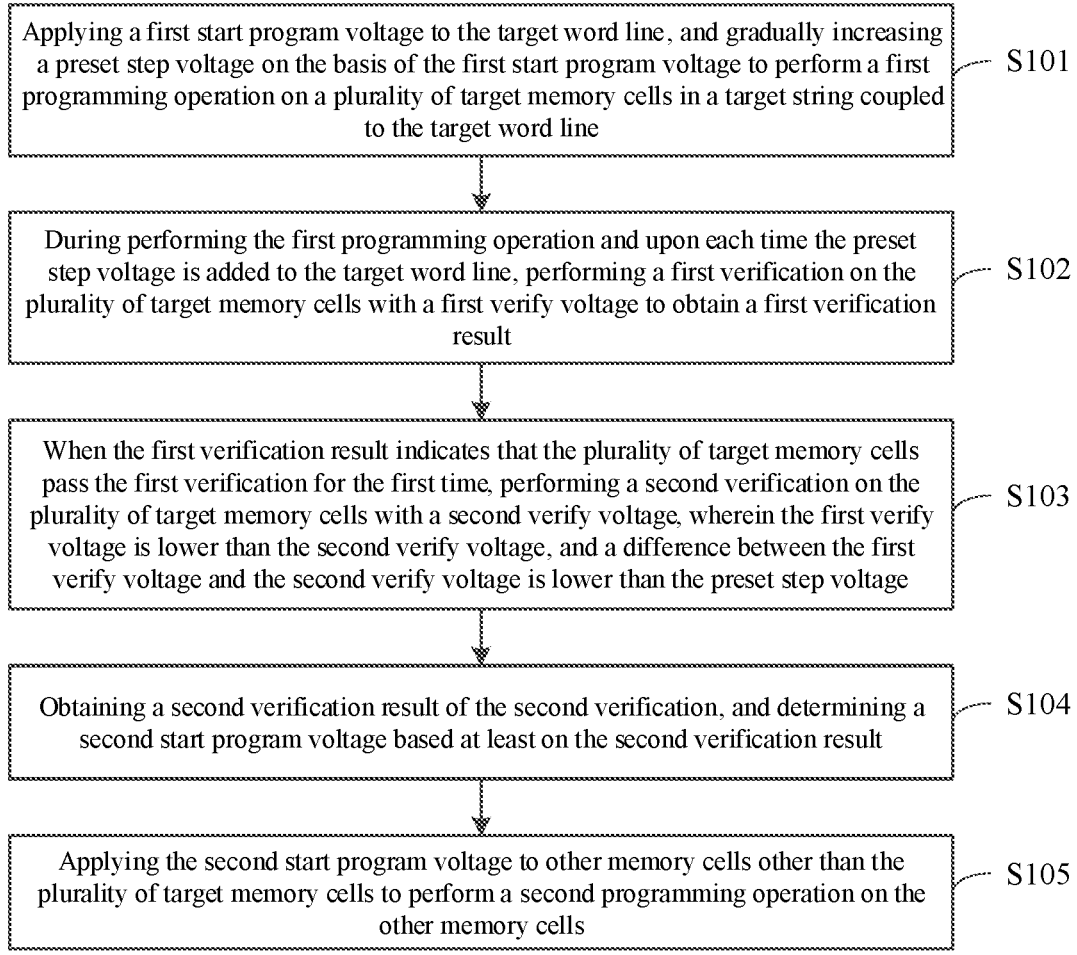
FIG. 10 is a schematic flowchart of an operating method for a memory according to an example of the present application.

Further, as shown in FIG. 9a and FIG. 9b, in the first verification step S102, the voltage value of the first verify voltage Vvrf_coarse1 is lower than the minimum threshold voltage under the above-mentioned target threshold state Lx. Therefore, in the example of the present application, the first verification, which is performed by taking the first verify voltage Vvrf_coarse1 as the measurement criterion, can be regarded as a coarse sensing verification for the plurality of target memory cells. When the first verification result indicates that the plurality of target memory cells pass the first verification, it means that the number of memory cells whose threshold voltage reaches at least the first verify voltage Vvrf_coarse1 meets the preset criterion, and the number of memory cells that are programmed into the target threshold state also roughly meets the preset criterion.

In the second verification step S103, the voltage value of the second verify voltage Vvrf_fine is higher than the value of the first verify voltage Vvrf_coarse1. Therefore, the second verification, which is performed by taking the second verify voltage Vvrf_fine as the measurement criterion, can be regarded as a fine sensing verification for the target memory cells. It should be understood that only when the number of memory cells whose threshold voltage reaches at least the first verify voltage Vvrf_coarse1 meets the preset criterion, the second verification performed is meaningful. Moreover, to ensure that the above-mentioned over-program phenomenon does not occur in the memory, when the first verification result indicates that the plurality of target memory cells pass the first verification for the first time, it is necessary to start performing the second verification, and it is determined whether the number of memory cells whose threshold voltage reaches at least the second verify voltage Vvrf_fine meets the preset criterion.

It should be understood that, in some implementations, the voltage value of the second verify voltage Vvrf_fine may be equal to the minimum threshold voltage in the aforementioned target threshold state Lx. Further, in the example of the present application, the first verification and the second verification are designed to control the range of the adjustment of the first start program voltage Vstart_pgm1 within a preset step voltage Vispp, so as to improve the precision of the adjustment. Therefore, the difference between the first verify voltage Vvrf_coarse1 and the second verify voltage Vvrf_fine is lower than the preset step voltage Vispp.

It is noted that, as shown in FIG. 9a and FIG. 9b, when the second verification result indicates that the plurality of target memory cells pass the second verification, it means that the number of memory cells whose threshold voltage reaches at least the second verify voltage Vvrf_fine meets preset criterion, and that the number of memory cells programmed into the target threshold state also accurately meets the preset criterion. While when the second verification result indicates that the plurality of target memory cells fail to pass the second verification, it means that the number of memory cells whose threshold voltage reaches at least the second verify voltage Vvrf_fine has not yet met the preset criterion, and that the number of memory cells programmed into the target threshold state has not accurately reached the preset criterion. Moreover, it further means: compared with the initial threshold voltages (indicated in FIG. 9a as "Vt1") of the plurality of target memory cells passed the second verification and the other memory cells coupled to the corresponding target word lines other than the plurality of target memory cells, the initial threshold voltages (indicated in FIG. 9b as "Vt2") of the plurality of target memory cells that have not passed the second verification and the other memory cells coupled to the corresponding target word lines other than the plurality of target memory cells are lower.

Figure 11:
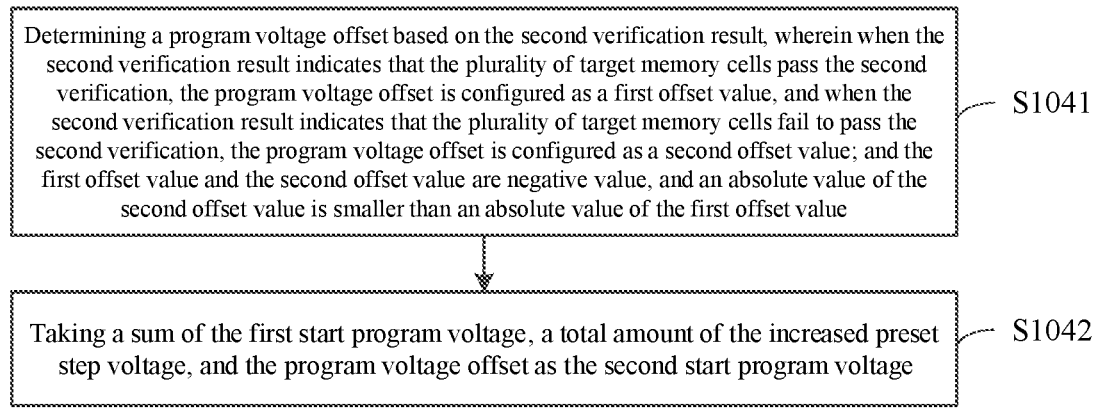
FIG. 11 is a further schematic flowchart of the operating method for the memory according to an example of the present application.

Therefore, it may be considered to design a different offset dsv_offset as described above for target word lines coupled to a plurality of target memory cells with different second verification results, so that the second start program voltage Vstart_pgm2 obtained based on adjustment of the first start program voltage Vstart_pgm1 is more accurate. For example, as shown in FIG. 11, "determining the second start program voltage based at least on the second verification result" in the second start program voltage determining step S104 may specifically include the following steps:

program voltage offset determining step S1041: determining a program voltage offset dsv_offset' based on the second verification result, wherein when the second verification result indicates that the plurality of target memory cells pass the second verification, the program voltage offset dsv_offset' is configured as a first offset value offset1, and when the second verification result indicates that the plurality of target memory cells fail to pass the second verification, the program voltage offset dsv_offset' is configured as a second offset value offset2; and the first offset value offset1 and the second offset value offset2 are negative values, the absolute value of the second offset value offset2 is lower than the absolute value of the first offset value offset1; and second start program voltage determining step S1042: taking the sum of the first start program voltage Vstart_pgm1, the total amount of the increased preset step voltage Vispp, and the program voltage offset dsv_offset' as the second start program voltage Vstart_pgm2.

Specifically, taking the number of increased preset step voltage Vispp as x (the value of x is 0 or a positive integer greater than 0) as an example, the above-mentioned second start program voltage Vstart_pgm2 can be calculated by the following equation 1:

$$V\text{start\_pgm2} = V\text{start\_pgm1} + x^*V\text{ispp} + dsv\_\text{offset'}.$$

It is noted that the setting of the second start program voltage Vstart_pgm2 needs to further consider the influence of the above-mentioned over-program. Therefore, when the memory cell coupled to the target word line has a relatively large initial threshold voltage, it is necessary to add a negative value with a larger absolute value on the basis of the sum of the first start program voltage Vstart_pgm1 and the total amount of the increased preset step voltage Vispp, and when the memory cell coupled to the target word line has a relatively small initial threshold voltage, it is necessary to add a negative value with a smaller absolute value on the basis of the sum of the first start program voltage Vstart_pgm1 and the total amount of the increased preset step voltage Vispp. Therefore, when calculating the second start program voltage Vstart_pgm2 according to the above equation, it is necessary to ensure that the absolute value of the second offset value offset2 is smaller than the absolute value of the first offset value offset1.

It should be understood that the second start program voltage Vstart_pgm2 can also be obtained by subtracting a program voltage offset dsv_offset', which is a positive value, from the sum of the first start program voltage Vstart_pgm1 and the total amount of the increased preset step voltage Vispp. Therefore, the above-mentioned second start program voltage Vstart_pgm2 can also be calculated by the following equation 2:

$$V\text{start\_pgm2} = V\text{start\_pgm1} - Fx^*V\text{ispp} - dsv\_\text{offset'}.$$

According to this implementation, the first offset value offset1 and the second offset value offset2 are positive values, and the absolute value of the second offset value offset2 is smaller than that of the first offset value offset1.

It should be noted that, in the example of the present application, the value of the voltage offset dsv_offset' set for the target word line coupled to the plurality of target memory cells with different second verification results is specifically related to the difference between the first verify voltage Vvrf_coarse1 and the second verify voltage Vvrf_fine, and when setting the above-mentioned voltage offset dsv_offset', it is also necessary to ensure that there will be no over-program phenomenon in the memory. Therefore, the value of the voltage offset dsv_offset' is further related to the first start program voltage Vstart_pgm1 and the preset step voltage Vispp, specifically, "determining the program voltage offset based on the second verification result" in the program voltage offset determining step S1041 may specifically include the following steps:

determining the program voltage offset based on the difference between the first verify voltage and the second verify voltage, the first start program voltage, the preset step voltage and the second verification result.

Figure 12:
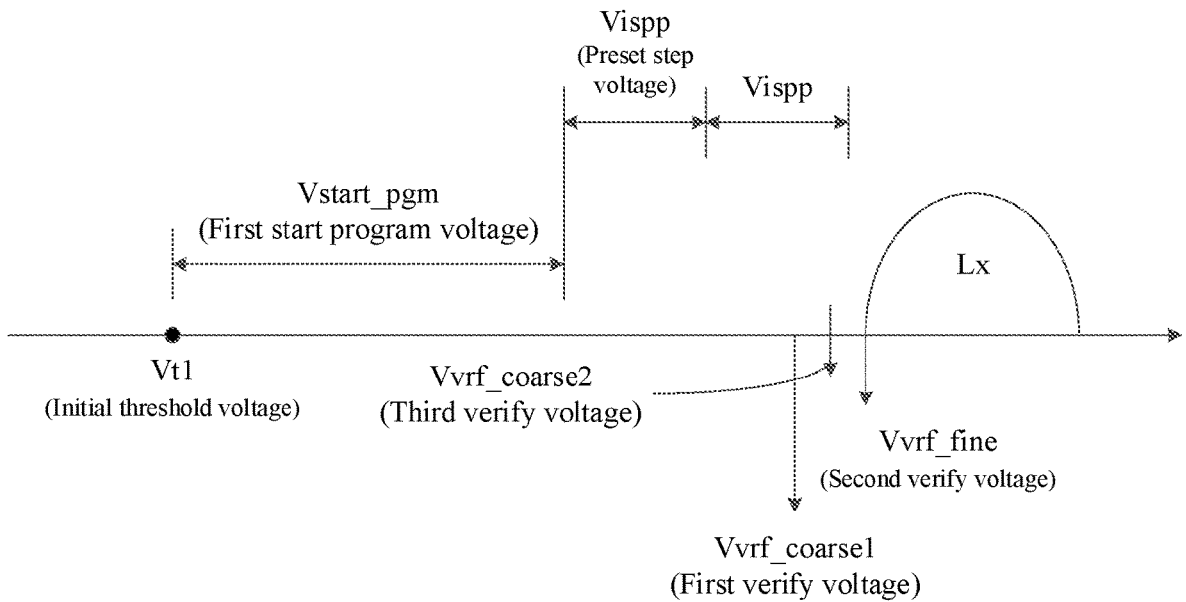
FIG. 12 is a schematic diagram of performing a first verification, second verification and third verification on a plurality of target memory cells with a first verify voltage, second verify voltage and third verify voltage according to the example of the present application.

Furthermore, the inventor of the present application also proposes that the third verification can be introduced after the above-mentioned first verification and before the second verification, so as to further subdivide the target word lines coupled to the plurality of target memory cells with different second verification results. Specifically, as shown in FIG. 12, after the step of performing the first verification on the plurality of target memory cells with the first verify voltage Vvrf_coarse1, and before the step of performing the second verification on the plurality of target memory cells with the second verify voltage Vvrf_fine, the third verification is performed on the plurality of target memory cells with the third verify voltage Vvrf_coarse2, wherein the third verify voltage Vvrf_coarse2 is between the first verify voltage Vvrf_coarse1 and the second verify voltage Vvrf_fine. Therefore, in this implementation, the second start program voltage determining step S104 described above may specifically include the following steps:

obtaining a third verification result of the third verification and the second verification result of the second verification, and determining the second start program voltage based on at least the third verification result and the second verification result.

Next, it will be described by taking the second start program voltage Vstart_pgm2 calculated by the above-mentioned "equation 1" as an example. When the plurality of target memory cells (for ease of description, referred to as "sampling page 430_t" mentioned above) fail to pass the third verification, the first sub-offset value offset11 is configured for the target word line. When the sampling page 430_t passes the third verification but fails to pass the second verification, the second sub-offset value offset12 is configured for the target word line, and when the sampling page 430_t passes the second verification, the third sub-offset value offset13 is configured for the target word line. The first sub-offset value offset11, the second sub-offset value offset12 and the third sub-offset value offset13 are negative values. The absolute value of the first sub-offset value offset11 is smaller than the absolute value of the second sub-offset value offset12, and the absolute value of the second sub-offset value offset12 is smaller than the absolute value of the third sub-offset value offset13.

Specifically, the first sub-offset value offset11, the second sub-offset value offset12, the third sub-offset value offset13, the above-mentioned first offset value offset1 and the second offset value offset2 may be stored in a register of the peripheral circuit of the memory. When the above-mentioned second program step S105 is performed on the memory, the above-mentioned offset values are read from the register to configure the second start program voltage Vstart_pgm2.

Figure 13:
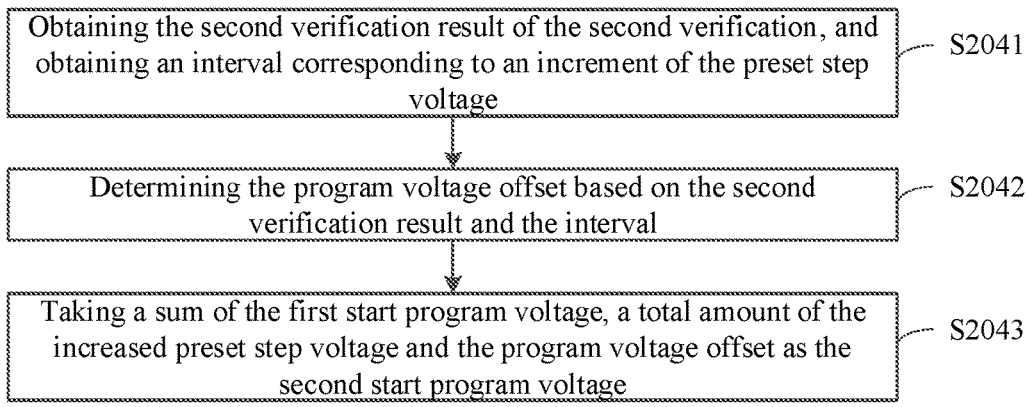
FIG. 13 is a further schematic flowchart of the operating method for the memory according to an example of the present application.

Further, when designing the above-mentioned voltage offset dsv_offset', the way of subdividing the target word lines coupled to the plurality of target memory cells with different second verification results can be further based on the number of applied preset step voltage Vispp (or the interval corresponding to the number) when the plurality of target memory cells pass through the first verification. For example, in some implementations, as shown in FIG. 13, the above-mentioned second start program voltage determining step S104 can further include the following steps:

first step S2041: obtaining the second verification result of the second verification, and obtaining the interval corresponding to the increment of the preset step voltage;

second step S2042: determining the program voltage offset based on the second verification result and the interval; and third step S2043: taking the sum of the first start program voltage, the total amount of the increased preset step voltage and the program voltage offset as the second start program voltage.

It should be understood that different voltage offsets dsv_offset' may be designed for target word lines coupled to the plurality of target memory cells belonging to the same interval and having different second verification results, and for the target word lines coupled to the plurality of target memory cells belonging to different intervals respectively and having the same or different second verification results, the configured voltage offsets dsv_offset' are independent of each other.

Further, considering that when programming a memory cell into one of the multiple orders of threshold states, the programming operation with the target threshold state as the threshold state closest to the erased state is most affected by the configured second start program voltage Vstart_pgm2. Therefore, in some examples, the target threshold state is the threshold state closest to the erased state among the multiple orders of threshold states.

Further, in some implementation, each word line of the memory may be used as a target word line, and one or more pages are selected from each target word line as a sampling page. The memory cells in the sampling page are the target memory cells, and correspondingly, the pages coupled to each target word line other than the sampling page are the other pages (indicated with "430_q" in FIG. 8), and the memory cells in the other pages are the other memory cells. In this implementation, the above-mentioned second program step S105 may specifically include:

applying a second start program voltage to the other memory cells coupled to the target word line other than the plurality of target memory cells to perform a second programming operation on the other memory cells.

In some other implementations, multiple word lines can also be divided into multiple groups, one or more word lines can be selected in each group as target word lines, and the word lines other than the target word lines in each group are other word lines. After that, one or more pages are further selected from the target word lines as sampling pages, and pages other than the sampling page are other pages (indicated with "430_q" in FIG. 8). The memory cells in the sampling page are the target memory cells, and the memory cells other than the target memory cells are other memory cells. In this implementation, the above-mentioned second program step S105 may specifically include:

applying the second start program voltage to the other memory cells coupled to other word lines to perform a second programming operation on the other memory cells.

Furthermore, to prevent the second start program voltage Vstart_pgm2 from being frequently updated to cause waste of resources, the inventor of the present application proposes that during the process of storing user data, the steps of the first verification, the second verification and the determination of the second start program voltage in the first programming operation will be triggered only when the number of times that the above-mentioned the plurality of target memory cells (namely, sampling page 430_t) are programmed reaches a preset threshold.

Based on the same idea, the present application also provides a memory. The memory includes at least a memory array and a peripheral circuits, where the memory array includes at least a plurality of word lines and a plurality of strings, the plurality of word lines include a target word line, each of the word lines being coupled to the plurality of strings, each of the strings comprising a plurality of memory cells, the peripheral circuit is coupled to the memory array, and the peripheral circuit is configured to:

apply a first start program voltage to the target word line, and gradually increasing a preset step voltage based on the first start program voltage to perform a first programming operation on a plurality of target memory cells in a target string coupled to the target word line;

during performing the first programming operation and upon each time the preset step voltage is added to the target word line, perform a first verification on the plurality of target memory cells with a first verify voltage to obtain a first verification result;

when the first verification result indicates that the plurality of target memory cells pass the first verification for the first time, perform a second verification on the plurality of target memory cells with a second verify voltage, wherein the first verify voltage is lower than the second verify voltage, and a difference between the first verify voltage and the second verify voltage is lower than the preset step voltage;

obtain a second verification result of the second verification, and determining a second start program voltage based at least on the second verification result; and apply the second start program voltage to other memory cells other than the plurality of target memory cells to perform a second programming operation on the other memory cells.

In some examples, the peripheral circuit is further configured to:
- determine a program voltage offset based on the second verification result, wherein when the second verification result indicates that the plurality of target memory cells pass the second verification, the program voltage offset is configured as a first offset value, and when the second verification result indicates that the plurality of target memory cells fail to pass the second verification, the program voltage offset is configured as a second offset value;
- take a sum of the first start program voltage, a total amount of the increased preset step voltage, and the program voltage offset as the second start program voltage;
- wherein the first offset value and the second offset value are negative values, and the second offset value is smaller than the first offset value.

In some examples, the peripheral circuit further includes a plurality of registers, and the first offset value and the second offset value are stored in the registers.

In some examples, the peripheral circuit is further configured to:
- obtain the second verification result of the second verification, and obtaining an interval corresponding to an increment of the preset step voltage;
- determine the program voltage offset based on the second verification result and the interval; and
- take a sum of the first start program voltage, a total amount of the increased preset step voltage and the program voltage offset as the second start program voltage.

In some examples, the plurality of word lines are divided into a plurality of groups, each of the groups comprises the target word line and other word lines, and the other memory cells are coupled to the other word lines.

In some examples, the other memory cells are coupled to the target word line.

It should be noted that the technical solution adopted in the above-mentioned memory and the technical solution adopted in the operating method of the memory mentioned above belong to the same inventive concept, and both have the same technical features. The terms appearing in the operating method of the memory and the technical solution of the present application have been described in detail, and the terms appearing here can then be understood according to the meaning of the foregoing description, and will not be repeated here.

Based on the same idea, the present application also provides a memory system, which includes at least a memory and a controller, wherein the controller is coupled to the memory and configured to control peripheral circuits.

It should be noted that the above-mentioned memory system includes the memory as described above, both of which have the same technical features. Terms appearing in the memory, the operating method of the memory and the technical solution of the present application have been described in detail above, and the terms appearing here can be understood according to the meaning of the foregoing description, and will not be repeated here.

According to the foregoing, the present application provides an operating method for a memory, a memory and a memory system, the memory comprising at least a plurality of word lines and a plurality of strings, and the plurality of word lines comprising a target word line, and each of the word lines being coupled to the plurality of strings, each of the strings comprising a plurality of memory cells, and the operating method comprising at least the following steps: applying a first start program voltage to the target word line, and gradually increasing a preset step voltage on the basis of the first start program voltage to perform a first programming operation on a plurality of target memory cells in a target string coupled to the target word line; during performing the first programming operation and upon each time the preset step voltage is added to the target word line, performing a first verification on the plurality of target memory cells with a first verify voltage to obtain a first verification result; when the first verification result indicates that the plurality of target memory cells pass the first verification for the first time, performing a second verification on the plurality of target memory cells with a second verify voltage, the first verify voltage is lower than the second verify voltage, and a difference between the first verify voltage and the second verify voltage is lower than the preset step voltage; obtaining a second verification result of the second verification, and determining a second start program voltage based at least on the second verification result; applying the second start program voltage to other memory cells other than the plurality of target memory cells to perform a second programming operation on the other memory cells. According to the present application, during the first programming operation, the first verification and the second verification are performed on the plurality of target memory cells with the first verify voltage and the second verify voltage, and the second start program voltage is determined based on at least the second verification result, ensuring the accuracy of the second start program voltage, thereby reducing the programming time of the memory and improving the programming efficiency of the memory.

To solve the above or other problems, the present application provides the following technical solutions.

In a first aspect, the present application provides an operating method for a memory, the memory comprising at least a plurality of word lines and a plurality of strings, and the plurality of word lines comprising a target word line, and each of the word lines being coupled to the plurality of strings, each of the strings comprising a plurality of memory cells, and the operating method comprising at least:
- applying a first start program voltage to the target word line, and gradually increasing a preset step voltage based on the first start program voltage to perform a first programming operation on a plurality of target memory cells in a target string coupled to the target word line;
- during performing the first programming operation and upon each time the preset step voltage is added to the target word line, performing a first verification on the plurality of target memory cells with a first verify voltage to obtain a first verification result;
- when the first verification result indicates that the plurality of target memory cells pass the first verification for the first time, performing a second verification on the plurality of target memory cells with a second verify voltage, wherein the first verify voltage is lower than the second verify voltage, and a difference between the first verify voltage and the second verify voltage is lower than the preset step voltage;
- obtaining a second verification result of the second verification, and determining a second start program voltage based at least on the second verification result; and
- applying the second start program voltage to other memory cells other than the plurality of target memory cells to perform a second programming operation on the other memory cells.

The operating method according to the example of the present application, wherein the step of determining the second start program voltage based at least on the second verification result specifically comprises:
- determining a program voltage offset based on the second verification result, wherein when the second verification result indicates that the plurality of target memory cells pass the second verification, the program voltage offset is configured as a first offset value, and when the second verification result indicates that the plurality of target memory cells fail to pass the second verification, the program voltage offset is configured as a second offset value;
- taking a sum of the first start program voltage, a total amount of the increased preset step voltage, and the program voltage offset as the second start program voltage;
- wherein the first offset value and the second offset value are negative values, and an absolute value of the second offset value is smaller than an absolute value of the first offset value.

The operating method according to the example of the present application, wherein the step of determining the program voltage offset based on the second verification result specifically comprises:
- determining the program voltage offset based on a difference between the first verify voltage and the second verify voltage, the first start program voltage, the preset step voltage, and the second verification result.

The operating method according to the example of the present application, wherein the step of obtaining the second verification result of the second verification and determining the second start program voltage based at least on the second verification result specifically comprises:
- obtaining the second verification result of the second verification, and obtaining an interval corresponding to an increment of the preset step voltage;
- determining the program voltage offset based on the second verification result and the interval; and
- taking a sum of the first start program voltage, a total amount of the increased preset step voltage and the program voltage offset as the second start program voltage.

The operating method according to the example of the present application, wherein before the step of performing the second verification on the plurality of target memory cells with the second verify voltage, further comprising performing a third verification on the plurality of target memory cells with a third verify voltage, wherein the third verify voltage is between the first verify voltage and the second verify voltage, and the step of obtaining the second verification result of the second verification and determining the second start program voltage based at least on the second verification result specifically comprises:
- obtaining a third verification result of the third verification and the second verification result of the second verification, and determining the second start program voltage based on at least the third verification result and the second verification result.

The operating method according to the example of the present application, wherein the memory cells have multiple orders of threshold states, and one of the multiple orders of threshold states is an erased state, wherein the first programming operation is configured to program the plurality of target memory cells into a target threshold state, the target threshold state being the threshold state closest to the erased state.

The operating method according to the example of the present application, wherein the plurality of word lines are divided into a plurality of groups, each of the groups comprises the target word line and other word lines, and the step of applying the second start program voltage to the other memory cells other than the plurality of target memory cells to perform the second programming operation on the other memory cells specifically comprises:
- applying the second start program voltage to the other memory cells coupled to the other word lines to perform the second programming operation on the other memory cells.

The operating method according to the example of the present application, wherein the step of applying the second start program voltage to the other memory cells other than the plurality of target memory cells to perform the second programming operation on the other memory cells specifically comprises:
- applying the second start program voltage to the other memory cells coupled to the target word line other than the plurality of target memory cells to perform the second programming operation on the other memory cells.

The operating method according to the example of the present application, wherein the operating method further includes:
- when the number of times the plurality of target memory cells are programmed reaches a preset threshold, triggering to perform the first verification, the second verification, and the determination of the second start program voltage in the first programming operation.

In a second aspect, the present application provides a memory, the memory including at least:
- a memory array comprising at least a plurality of word lines and a plurality of strings, the plurality of word lines comprising a target word line, each of the word lines being coupled to the plurality of strings, each of the strings comprising a plurality of memory cells; and
- a peripheral circuit coupled to the memory array, the peripheral circuit being configured to:
- apply a first start program voltage to the target word line, and gradually increasing a preset step voltage based on the first start program voltage to perform a first programming operation on a plurality of target memory cells in a target string coupled to the target word line;
- during performing the first programming operation and upon each time the preset step voltage is added to the target word line, perform a first verification on the plurality of target memory cells with a first verify voltage to obtain a first verification result;
- when the first verification result indicates that the plurality of target memory cells pass the first verification for the first time, perform a second verification on the plurality of target memory cells with a second verify voltage, wherein the first verify voltage is lower than the second verify voltage, and a difference between the first verify voltage and the second verify voltage is lower than the preset step voltage;
- obtain a second verification result of the second verification, and determining a second start program voltage based at least on the second verification result; and
- apply the second start program voltage to other memory cells other than the plurality of target memory cells to perform a second programming operation on the other memory cells.

The memory according to the example of the present application, wherein the peripheral circuit is further configured to:
 determine a program voltage offset based on the second verification result, wherein when the second verification result indicates that the plurality of target memory cells pass the second verification, the program voltage offset is configured as a first offset value, and when the second verification result indicates that the plurality of target memory cells fail to pass the second verification, the program voltage offset is configured as a second offset value;
 take a sum of the first start program voltage, a total amount of the increased preset step voltage, and the program voltage offset as the second start program voltage;
 wherein the first offset value and the second offset value are negative values, and an absolute value of the second offset value is smaller than an absolute value of the first offset value.

The memory according to the example of the present application, wherein the peripheral circuit further includes a plurality of registers, and the first offset value and the second offset value are stored in the registers.

The memory according to the example of the present application, wherein the peripheral circuit is further configured to:
 obtain the second verification result of the second verification, and obtaining an interval corresponding to an increment of the preset step voltage;
 determine the program voltage offset based on the second verification result and the interval; and
 take a sum of the first start program voltage, a total amount of the increased preset step voltage and the program voltage offset as the second start program voltage.

The memory according to the example of the present application, wherein the plurality of word lines are divided into a plurality of groups, each of the groups includes the target word line and other word lines, and the other memory cells are coupled to the other word lines.

The memory according to the example of the present application, wherein the other memory cells are coupled to the target word line.

In a third aspect, the present application provides a memory system, wherein the memory system includes at least:
 the memory as described in any preceding item; and
 a controller coupled to the memory and configured to control the peripheral circuit.

The beneficial effects of the present application are as follows. The present application provides an operating method for a memory, a memory and a memory system, the memory comprising at least a plurality of word lines and a plurality of strings, and the plurality of word lines comprising a target word line, and each of the word lines being coupled to the plurality of strings, each of the strings comprising a plurality of memory cells, and the operating method comprising at least the following steps: applying a first start program voltage to the target word line, and gradually increasing a preset step voltage on the basis of the first start program voltage to perform a first programming operation on a plurality of target memory cells in a target string coupled to the target word line; during performing the first programming operation and upon each time the preset step voltage is added to the target word line, performing a first verification on the plurality of target memory cells with a first verify voltage to obtain a first verification result; when the first verification result indicates that the plurality of target memory cells pass the first verification for the first time, performing a second verification on the plurality of target memory cells with a second verify voltage, the first verify voltage is lower than the second verify voltage, and a difference between the first verify voltage and the second verify voltage is lower than the preset step voltage; obtaining a second verification result of the second verification, and determining a second start program voltage based at least on the second verification result; applying the second start program voltage to other memory cells other than the plurality of target memory cells to perform a second programming operation on the other memory cells. According to the present application, during the first programming operation, the first verification and the second verification are performed on the plurality of target memory cells with the first verify voltage and the second verify voltage, and the second start program voltage is determined based on at least the second verification result, ensuring the accuracy of the second start program voltage, thereby reducing the programming time of the memory and improving the programming efficiency of the memory.

In addition to the above examples, the present application may be further implemented in other manners. All technical solutions formed by equivalent replacement or equivalent replacement fall within the scope of protection claimed by this application.

In summary, although the present application has disclosed the preferred examples above, the above preferred examples are not intended to limit the present application. Those of ordinary skills in the art can make various modifications without departing from the spirit and scope of the present application. Therefore, the scope of protection of the present application is defined by the claims.

What is claimed is:

1. An operating method for a memory, the memory including at least a plurality of word lines and a plurality of strings, the plurality of word lines including a target word line, and each of the word lines being coupled to the plurality of strings, each of the strings including a plurality of memory cells, and the operating method comprising at least:
 applying a first start program voltage to the target word line;
 increasing a preset step voltage based on the first start program voltage to perform a first programming operation on a plurality of target memory cells in a target string coupled to the target word line;
 during performing the first programming operation and upon each time the preset step voltage is added to the target word line, performing a first verification on the plurality of target memory cells with a first verify voltage to obtain a first verification result;
 when the first verification result indicates that the plurality of target memory cells pass the first verification for a first time, performing a second verification on the plurality of target memory cells with a second verify voltage, wherein the first verify voltage is lower than the second verify voltage, and a difference between the first verify voltage and the second verify voltage is lower than the preset step voltage;
 obtaining a second verification result of the second verification;
 determining a second start program voltage based at least on the second verification result, wherein determining the second start program voltage further includes:

determining a program voltage offset based on the second verification result, wherein when the second verification result indicates that the plurality of target memory cells pass the second verification, the program voltage offset is configured as a first offset value, and when the second verification result indicates that the plurality of target memory cells fail the second verification, the program voltage offset is configured as a second offset value; and summing of the first start program voltage, a total increase of the preset step voltage, and the program voltage offset to define the second start program voltage, wherein the first offset value and the second offset value are negative values, and an absolute value of the second offset value is smaller than an absolute value of the first offset value; and applying the second start program voltage to other memory cells other than the plurality of target memory cells to perform a second programming operation on the other memory cells.

2. The operating method of claim 1, wherein determining the program voltage offset based on the second verification result includes determining the program voltage offset based on the difference between the first verify voltage and the second verify voltage, the first start program voltage, the preset step voltage, and the second verification result.

3. The operating method of claim 1, wherein obtaining the second verification result of the second verification and determining the second start program voltage based at least on the second verification result includes:
    obtaining the second verification result of the second verification;
    obtaining an interval corresponding to an increment of the preset step voltage;
    determining a program voltage offset based on the second verification result and the interval; and
    summing of the first start program voltage, the total increase of the preset step voltage and the program voltage offset to define the second start program voltage.

4. The operating method of claim 1, wherein:
    before performing the second verification on the plurality of target memory cells with the second verify voltage, further includes performing a third verification on the plurality of target memory cells with a third verify voltage, wherein the third verify voltage is between the first verify voltage and the second verify voltage; and
    obtaining the second verification result of the second verification and determining the second start program voltage based at least on the second verification result includes obtaining a third verification result of the third verification and the second verification result of the second verification, and determining the second start program voltage based on at least the third verification result and the second verification result.

5. The operating method of claim 1, wherein the memory cells have multiple orders of threshold states, and one of the multiple orders of the threshold states is an erased state, wherein the first programming operation is configured to program the plurality of target memory cells into a target threshold state, the target threshold state being a threshold state closest to the erased state.

6. The operating method of claim 1, wherein the plurality of word lines are divided into a plurality of groups, each of the groups includes the target word line and other word lines, and the step of applying the second start program voltage to the other memory cells other than the plurality of target memory cells to perform the second programming operation on the other memory cells includes applying the second start program voltage to the other memory cells coupled to the other word lines to perform the second programming operation on the other memory cells.

7. The operating method of claim 1, wherein applying the second start program voltage to the other memory cells other than the plurality of target memory cells to perform the second programming operation on the other memory cells includes applying the second start program voltage to the other memory cells coupled to the target word line other than the plurality of target memory cells to perform the second programming operation on the other memory cells.

8. The operating method of claim 1, further including, when a number of times the plurality of target memory cells are programmed reaches a preset threshold, triggering to perform the first verification, the second verification, and a determination of the second start program voltage in the first programming operation.

9. A memory, comprising at least:
    a memory array including at least a plurality of word lines and a plurality of strings, the plurality of word lines including a target word line, each of the word lines being coupled to the plurality of strings, each of the strings including a plurality of memory cells; and
    a peripheral circuit coupled to the memory array, the peripheral circuit configured to:
        apply a first start program voltage to the target word line;
        increase a preset step voltage based on the first start program voltage to perform a first programming operation on a plurality of target memory cells in a target string coupled to the target word line;
        during performing the first programming operation and upon each time the preset step voltage is added to the target word line, perform a first verification on the plurality of target memory cells with a first verify voltage to obtain a first verification result;
        when the first verification result indicates that the plurality of target memory cells pass the first verification for a first time, perform a second verification on the plurality of target memory cells with a second verify voltage, wherein the first verify voltage is lower than the second verify voltage, and a difference between the first verify voltage and the second verify voltage is lower than the preset step voltage;
        obtain a second verification result of the second verification;
        determine a second start program voltage based at least on the second verification result, wherein to determine the second start program voltage further includes:
            determine a program voltage offset based on the second verification result, wherein when the second verification result indicates that the plurality of target memory cells pass the second verification, the program voltage offset is configured as a first offset value, and when the second verification result indicates that the plurality of target memory cells fail the second verification, the program voltage offset is configured as a second offset value; and
            sum the first start program voltage, a total increase of the preset step voltage, and the program voltage offset to define the second start program voltage, wherein the first offset value and the second offset value are negative values, and an absolute value of the second offset value is smaller than an absolute value of the first offset value; and apply the second start program voltage to other memory cells other than the plurality of target memory cells to perform a second programming operation on the other memory cells.

10. The memory of claim 9, wherein the peripheral circuit further includes a plurality of registers, and the first offset value and the second offset value are stored in the registers.

11. The memory of claim 9, wherein the peripheral circuit is further configured to:

obtain the second verification result of the second verification;

obtain an interval corresponding to an increment of the preset step voltage;

determine a program voltage offset based on the second verification result and the interval; and sum the first start program voltage, the total increase of the preset step voltage and the program voltage offset to define the second start program voltage.

12. The memory of claim 9, wherein the plurality of word lines are divided into a plurality of groups, each of the groups includes the target word line and other word lines, and the other memory cells are coupled to the other word lines.

13. The memory of claim 9, wherein the other memory cells are coupled to the target word line.

14. A memory system, the memory system comprising at least:

a memory array including at least a plurality of word lines and a plurality of strings, the plurality of word lines including a target word line, each of the word lines being coupled to the plurality of strings, each of the strings including a plurality of memory cells; and a peripheral circuit coupled to the memory array, the peripheral circuit configured to:

apply a first start program voltage to the target word line;

increase a preset step voltage based on the first start program voltage to perform a first programming operation on a plurality of target memory cells in a target string coupled to the target word line;

during performing the first programming operation and upon each time the preset step voltage is added to the target word line, perform a first verification on the plurality of target memory cells with a first verify voltage to obtain a first verification result;

when the first verification result indicates that the plurality of target memory cells pass the first verification for a first time, perform a second verification on the plurality of target memory cells with a second verify voltage, wherein the first verify voltage is lower than the second verify voltage, and a difference between the first verify voltage and the second verify voltage is lower than the preset step voltage;

obtain a second verification result of the second verification;

determine a second start program voltage based at least on the second verification result, wherein to determine the second start program voltage further includes:

determine a program voltage offset based on the second verification result, wherein when the second verification result indicates that the plurality of target memory cells pass the second verification, the program voltage offset is configured as a first offset value, and when the second verification result indicates that the plurality of target memory cells fail the second verification, the program voltage offset is configured as a second offset value; and sum the first start program voltage, a total increase of the preset step voltage, and the program voltage offset to define the second start program voltage, wherein the first offset value and the second offset value are negative values, and an absolute value of the second offset value is smaller than an absolute value of the first offset value; and apply the second start program voltage to other memory cells other than the plurality of target memory cells to perform a second programming operation on the other memory cells; and a controller coupled to the memory array and configured to control the peripheral circuit.

15. The memory system of claim 14, wherein the peripheral circuit further includes a plurality of registers, and the first offset value and the second offset value are stored in the registers.

16. The memory system of claim 14, wherein the peripheral circuit is further configured to:

obtain the second verification result of the second verification;

obtain an interval corresponding to an increment of the preset step voltage;

determine a program voltage offset based on the second verification result and the interval; and summing the first start program voltage, the total increase of the preset step voltage and the program voltage offset to define the second start program voltage.

17. The memory system of claim 14, wherein the plurality of word lines are divided into a plurality of groups, each of the groups includes the target word line and other word lines, and the other memory cells are coupled to the other word lines.

18. The memory system of claim 14, wherein the other memory cells are coupled to the target word line.

* * * * *